(12) United States Patent
Xu et al.

(10) Patent No.: US 9,484,275 B2
(45) Date of Patent: Nov. 1, 2016

(54) SEMICONDUCTOR MODULE FOR HIGH PRESSURE APPLICATIONS

(71) Applicant: GE Energy Power Conversion Technology Ltd, Warwickshire (GB)

(72) Inventors: Fei Xu, Shanghai (CN); Pengcheng Zhu, Shanghai (CN); Yingqi Zhang, Shanghai (CN)

(73) Assignee: GE ENERGY POWER CONVERSION TECHNOLOGY LTD, Warwickshire (GB)

( * ) Notice: Subject to any disclaimer, the term of this patent is extended or adjusted under 35 U.S.C. 154(b) by 0 days.

(21) Appl. No.: 14/811,394

(22) Filed: Jul. 28, 2015

(65) Prior Publication Data
US 2016/0027710 A1   Jan. 28, 2016

(30) Foreign Application Priority Data
Jul. 28, 2014   (CN) .......................... 2014 1 0362946

(51) Int. Cl.
*H01L 23/051*   (2006.01)
*H01L 23/22*    (2006.01)
(Continued)

(52) U.S. Cl.
CPC ............. *H01L 23/051* (2013.01); *H01L 23/10* (2013.01); *H01L 23/12* (2013.01); *H01L 23/22* (2013.01);
(Continued)

(58) Field of Classification Search
CPC ..... H01L 23/051; H01L 23/22; H01L 23/42; H01L 23/473; H01L 25/0655; H01L 23/492; H01L 24/33; H01L 23/12; H01L 24/72; H01L 25/102; H01L 2224/33181; H01L 2224/32245; H01L 2225/1094; H01L 2225/1076; H01L 2225/1047

USPC ....... 257/685, 693, 777, 686, 723, 778, 712, 257/713, 710, 706, 704
See application file for complete search history.

(56) References Cited

U.S. PATENT DOCUMENTS

| 5,278,434 A | 1/1994 | Niwayama |
| 5,346,859 A | 9/1994 | Niwayama |

(Continued)

FOREIGN PATENT DOCUMENTS

| DE | 10316355 B3 | 7/2004 |
| EP | 0411119 A4  | 5/1991 |
| FR | 2518812 A1  | 6/1983 |

OTHER PUBLICATIONS

Barnes et al., "A Review of Pressure-Tolerant Electronics (PTE)", Naval Research Laboratory, pp. 1-38, Jun. 1976.
(Continued)

*Primary Examiner* — Alexander Oscar Williams
(74) *Attorney, Agent, or Firm* — Catherine J. Toppin; GE Global Patent Operation (57) ABSTRACT

A semiconductor module comprising a plurality of electrically conductive top plates, an electrically conductive base plate, a plurality of semiconductor chips installed on the base plate, a first power supply connected to the plates, a second power supply connected to the plates and an electrically insulating outer casing component. The semiconductor chips are individually in contact with the top plates. Each semiconductor chip comprises a first electrode electrically coupled with the base plate, and a second electrical pole electrically coupled with the corresponding top plate. The first power supply connecting plate is equipped with protruding parts that are individually in electrical contact with the top plates. The second power supply connecting plate is electrically connected to the base plate. The outer casing component is used to integrate the first power supply connecting plate and the second power supply connecting plate. The outer casing component comprises at least one opening.

16 Claims, 4 Drawing Sheets

(51) Int. Cl.

| | | |
|---|---|---|
| *H01L 23/42* | (2006.01) | |
| *H01L 23/473* | (2006.01) | |
| *H01L 25/065* | (2006.01) | |
| *H01L 23/492* | (2006.01) | |
| *H01L 23/00* | (2006.01) | |
| *H01L 23/12* | (2006.01) | |
| *H01L 25/10* | (2006.01) | |
| *H01L 23/10* | (2006.01) | |
| *H01L 25/07* | (2006.01) | |
| *H01L 25/11* | (2006.01) | |

(52) U.S. Cl.
CPC .............. *H01L 23/42* (2013.01); *H01L 23/473* (2013.01); *H01L 23/492* (2013.01); *H01L 24/33* (2013.01); *H01L 24/72* (2013.01); *H01L 25/0655* (2013.01); *H01L 25/072* (2013.01); *H01L 25/105* (2013.01); *H01L 25/11* (2013.01); *H01L 25/112* (2013.01); *H01L 25/115* (2013.01); *H01L 25/117* (2013.01); *H01L 2224/32245* (2013.01); *H01L 2224/33181* (2013.01); *H01L 2225/1047* (2013.01); *H01L 2225/1076* (2013.01); *H01L 2225/1094* (2013.01); *H01L 2924/13055* (2013.01); *H01L 2924/13091* (2013.01)

(56) References Cited

U.S. PATENT DOCUMENTS

| | | | |
|---|---|---|---|
| 5,705,853 | A | 1/1998 | Faller et al. |
| 5,990,501 | A | 11/1999 | Hiyoshi et al. |
| 6,921,456 | B2 | 7/2005 | Biberger et al. |
| 6,958,534 | B2 | 10/2005 | Stockmeier et al. |
| 7,040,016 | B2 * | 5/2006 | Bergstrom ............. B41J 2/1433 29/830 |
| 7,141,884 | B2 | 11/2006 | Kojima et al. |
| 7,255,772 | B2 | 8/2007 | Biberger et al. |
| 7,262,444 | B2 | 8/2007 | Fillion et al. |
| 7,538,436 | B2 | 5/2009 | Gunturi et al. |
| 7,829,386 | B2 | 11/2010 | Fillion et al. |
| 8,013,435 | B2 | 9/2011 | Truessel et al. |
| 8,237,171 | B2 | 8/2012 | Autry |
| 8,531,027 | B2 | 9/2013 | Gowda et al. |
| 2002/0189543 | A1 | 12/2002 | Biberger et al. |
| 2003/0122261 | A1 | 7/2003 | Bijlenga et al. |
| 2005/0221538 | A1 * | 10/2005 | Suzuki .............. H01L 23/24 438/126 |
| 2006/0118816 | A1 * | 6/2006 | Gunturi ............. H01L 23/051 257/178 |
| 2006/0126309 | A1 * | 6/2006 | Bolle ............... H05K 9/0033 361/719 |
| 2009/0081886 | A1 * | 3/2009 | Levy .............. C23C 16/45551 438/790 |
| 2011/0097494 | A1 * | 4/2011 | Kerr .............. C23C 16/45551 427/255.5 |
| 2013/0043579 | A1 | 2/2013 | Dugal |
| 2014/0327127 | A1 * | 11/2014 | Hable ............... H01L 21/50 257/712 |

OTHER PUBLICATIONS

Holzschuh, "Applications of Pressure Tolerant Electronics", Oceans'77, Los Angeles, CA, USA, pp. 729-734, Oct. 17-19, 1977.

Marquardt, "Five-Year Life Test Data on Pressure (10 000 lbf/in2) Tolerant Electronic Components", IEEE Transaction of Components, Hybrids, and, Manufacturing Technology, vol. No. 1, Issue No. 4, pp. 365-371, Dec. 1978.

Gilbert et al., "Analysis of the Performance of a Pressure-Tolerant Light-Emitting Diode/Fiber Optic Cable Interface", OCEANS '80, Seattle, WA, pp. 440-444, Sep. 8-10, 1980.

Snary et al., "Drive Systems for Operation on Deep-Sea Rovs", 10th European Conference on Power Electronics and Applications Toulouse, France, pp. 1-10, Sep. 2-4, 2003.

Pittini et al., "Pressure Tolerant Power Electronics for Deep and Ultra-Deep Water", Oil and Gas Facilities, vol. No. 1, Issue No. 1, pp. 47-52, Feb. 2012.

European Search Report and Opinion issued in connection with corresponding EP Application No. 15178253.9 on Dec. 2, 2015.

Petterteig, A. et al. "Pressure tolerant power IGBTs for subsea applications",Power Electronics and Applications, 2009. EPE '09. 13th European Conference on, IEEE Xplore, Sep. 8-10, 2009, pp. 1-10, Barcelona.

Kaufmann, S. et al. "Innovative press pack modules for high power IGBTs", Power Semiconductor Devices and ICs, 2001. ISPSD '01. Proceedings of the 13th International Symposium on, IEEE Xplore, 2001, pp. 59-62, Osaka.

* cited by examiner

SEMICONDUCTOR MODULE FOR HIGH PRESSURE APPLICATIONS

TECHNICAL FIELD

Embodiments of the present invention relate to a semiconductor module, a semiconductor module package and a semiconductor apparatus.

BACKGROUND

The majority of oil and gas exploration is carried out in seas at a depth of 1000 meters. Due to the gradual increase in demand for energy, offshore oil and gas exploration has been moving into deeper waters, such as seabeds at depths of 3000 meters. In order to secure effective and safe production, power electronic converters are installed under the sea and need to withstand the high pressure environment at the seabed.

A common method used in current offshore gas and oil exploration is to install the power electronic converters in a container able to withstand water pressure at a certain sea depth. However, as the rated power of power electronic converters in the depths of the sea increases, the thickness of the wall of the above-mentioned container needs to increase in order to withstand the increased water pressures at the seabed, leading to enormous increases in the volume and weight of the container, making it difficult to install such a container on the seabed. The above-mentioned increase of water pressure at the seabed due to increased depth can cause semiconductor chips in power electronic converters to be damaged by the pressure.

Furthermore, in order to isolate the power electronic converters from the undersea environment, the above-mentioned containers need to be sealed, and in one example, sealing of the container can be achieved using sealant. However, the continuing increases of sea depth leads to continual increases in the external pressure sustained by the container, further leading to increases in the pressure differential between the inside and outside of the container. This increase in pressure differential can easily damage the sealant used to seal the container, increasing the difficulty in sealing the container.

BRIEF SUMMARY OF THE INVENTION

Embodiments of the present invention cover one or more aspects of this invention to facilitate a basic understanding of it, but such coverage is not intended to be an extensive overview, nor is it intended to elucidate certain elements of the invention, nor to delineate its scope. On the contrary, the main intent of this coverage is to present certain concepts of this invention in a simplified form before presenting a more detailed description in the following text.

One aspect of this invention is to provide a semiconductor module. Such a semiconductor module comprises a plurality of electrically conductive top plates, an electrically conductive base plate, a plurality of semiconductor chips, a first power supply connecting plate, a second power supply, and an insulating outer casing component. The plurality of semiconductor chips are installed on the electrically conductive base plate, the plurality of semiconductor chips are individually in contact with the plurality of electrically conductive top plates, each semiconductor chip comprises a first electrode electrically coupled with the corresponding electrically conductive top plate, and a second electrode electrically coupled with the electrically conductive base plate. A first power supply connecting plate provided with a plurality of protruding parts, the plurality of protruding parts are individually in electrical contact with the plurality of electrically conductive top plates. The second power supply connecting plate is in electrical contact with the electrically conductive base plate. The electrically insulating casing component is utilized to integrate the first power supply connecting plate and the second power supply connecting plate, and the electrically insulating outer casing component is provided with at least one opening.

Another aspect of this invention is to provide a semiconductor module package. The semiconductor module package comprises at least two semiconductor modules and at least one power supply interconnection plate. Each semiconductor module package comprises a plurality of electrically conductive top plates, an electrically conductive base plate, a plurality of semiconductor chips, a first power supply connecting plate, a second power supply connecting plate and an electrically insulating outer casing component. The plurality of semiconductor chips are installed on the electrically conductive base plate, and the plurality of semiconductor chips are individually in contact with the plurality of electrically conductive top plates. Each semiconductor chip comprises a first electrode electrically coupled with a corresponding electrically conductive top plate, and a second electrode electrically coupled with the electrically conductive base plate. A first power supply connecting plate provided with a plurality of protruding parts, and the plurality of protruding parts are individually in electrical contact with the plurality of electrically conductive top plates. The second power supply connecting plate is in electrical contact with the electrically conductive base plate. The electrically insulating outer casing component is utilized to integrate the first power supply connecting plate and the second power supply connecting plate, and the electrically insulating outer casing component is provided with at least one opening. At least one power supply interconnection plate makes electrical contact between the second power supply connecting plate comprised in one of the two or more semiconductor modules, and the first power supply connecting plate comprised in the other single semiconductor module of the two or more semiconductor modules.

Another aspect of this invention is to provide a semiconductor module apparatus. The semiconductor apparatus comprises a semiconductor module. The semiconductor module comprises a plurality of electrically conductive top plates, an electrically conductive base plate, a plurality of semiconductor chips, a first power supply connecting plate, a second power supply connecting plate and an electrically insulating outer casing component.

A plurality of semiconductor chips is installed on the electrically conductive base plate, the plurality of semiconductor chips are individually in contact with the plurality of electrically conductive top plates; each semiconductor chip comprises a first electrode electrically coupled with the corresponding electrically conductive top plate and a second electrode electrically coupled with the electrically conductive base plate. The first power supply connecting plate is provided with a plurality of protruding parts, and the plurality of protruding parts are individually in electrical contact with the plurality of electrically conductive top plates. The second power supply connecting plate is in electrical contact with the electrically conductive base plate. The electrically insulating outer casing component is utilized to integrate the first power supply connecting plate and second power supply connecting plate. The semiconductor apparatus is sealed and the internal space in the semiconductor apparatus is filled with insulating fluid. When there is a pressure differential between the external pressure and in internal pressure of the semiconductor apparatus or there is a change in the temperature of the semiconductor apparatus, the volume of the semiconductor apparatus is changed to compensate for the change in volume of the insulating fluid.

Embodiments of the present invention provide a semiconductor module, a semiconductor module package and a semiconductor apparatus. When there is a pressure differential between the external pressure and internal pressure of the semiconductor apparatus, the change in volume of the insulating fluid can be compensated in order to achieve a balance in the internal and external pressures of the semiconductor module, effectively preventing damage to the semiconductor module due to excessive pressure.

BRIEF DESCRIPTION OF DRAWINGS

This invention may be better understood by describing implementation methods for embodiments of the present invention with reference to the accompanying drawings. In the accompanying drawings.

DETAILED DESCRIPTION

It should be pointed out that in the following implementation methods for this invention, the descriptions of these implementation methods have been made to provide a concise description of the invention, and that these specifications are not able to provide an equally detailed description of all features of the implementation methods. It should be understood that in the process of carrying out the specific implementation methods, the implementer will need to make specific judgments in order to implement the specific intent of the developer in order to satisfy systematic or commercial limitations, just as when undertaking any engineering project or design project, and this will give rise to differences from one implementation method to another. In addition, it should also be understood that although much complicated and prolonged effort was expended during the course of development, to a person with ordinary technical skills in the field of this disclosed invention, when he or she carries out design work on the basis of technical content disclosed for this invention, the manufacturer or producer only needs to modify regular technical methods and this should not be deemed a limitation of the content of this invention.

Unless otherwise defined, the meanings of technical and scientific terms employed in the Claims and Specifications should be taken as the ordinary meanings to persons with ordinary technical skills in the field of this invention. Expressions such as "first" and "second" employed in the patent application Specifications and Claims for this invention are not intended to denote a particular order, quantity or importance, and are merely employed to distinguish between different components. Numerals such as "one" do not indicate any limits of quantities, but indicate the existence of at least one of whatever is specified. Terms such as "comprise" or "include" indicate currently "including" or "comprising" the components or objects standing before this term encompass the components or object listed after the term, and do not exclude other components or objects. Terms such as "connected" or "interconnected" are not limited to a physical connection or mechanical connection, but also encompass electrical connections, irrespective of whether the connections are direct or indirect.

Figure 1:
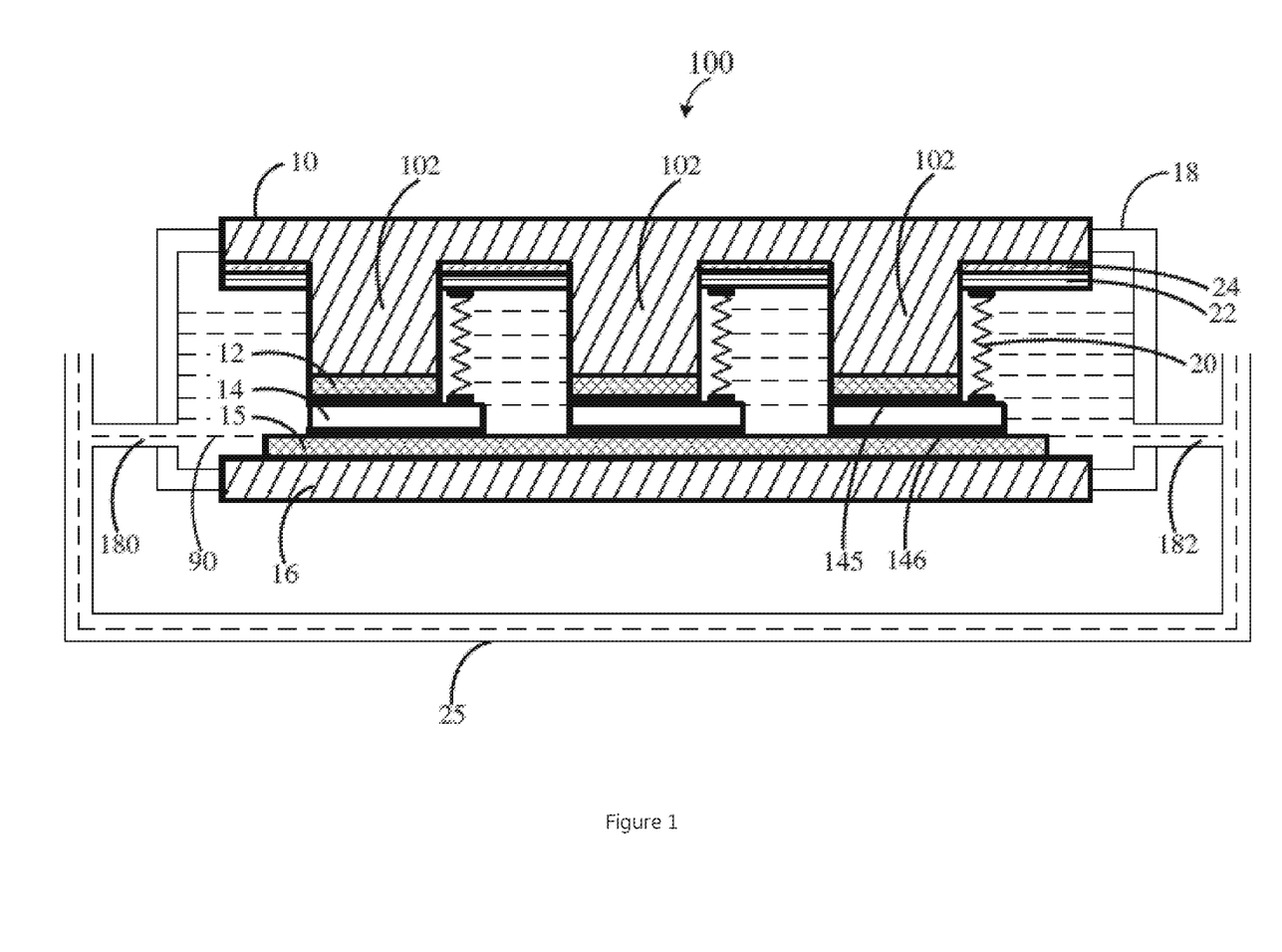
FIG. 1 is a sectional side view of one implementation method of the semiconductor module.

FIG. 1 is a section view of an implementation method for a semiconductor module 100. The semiconductor module 100 comprises a first power supply connecting plate 10, a plurality of electrically conductive top plates 12, a plurality of semiconductor chips 14, an electrically conductive base plate 15, a second power supply connecting plate 16 and an electrically insulating outer casing component 18.

It should be pointed out here that FIG. 1 shows the quantity of the plurality of electrically conductive top plates 12 and the plurality of semiconductor chips 14 as three in each case. In the non-limiting implementation example the quantity of the plurality of electrically conductive top plates 12 and semiconductor chips 14 can equally be two, three or more.

The first power supply connecting plate 10 is provided with protruding parts 102. Likewise, although the quantity of protruding parts 102 in FIG. 1 is shown as three, in the non-limiting implementation method the quantity of the plurality of protruding parts 102 can equally be two, three or more.

The plurality of electrically conductive top plates 12 are individually in electrical contact with the plurality of protruding parts 102.

The plurality of semiconductor chips 14 are installed on an electrically conductive base plate 15. The plurality of semiconductor chips 14 are individually in contact with the plurality of electrically conductive top plates 12. In the non-limiting implementation example each semiconductor chip 14 comprises an electrode and a second electrode, the first electrode is electrically coupled to the corresponding electrically conductive top plate 12, and the second electrode is electrically coupled with the electrically conductive base plate 15. In one implementation method, each electrically conductive top plate 12 and electrically conductive base plate 15 is made of copper.

The second power supply connecting plate 16 is in electrical contact with the electrically conductive base plate 15.

The electrically insulating outer casing component 18 is utilized to integrate the first power supply connecting plate 12 and second power supply connecting plate 16. The electrically insulating outer casing component 18 is provided with two openings 180, 182. In other implementation examples, the electrically insulating outer casing component 18 is only provided with one opening.

The two openings 180, 182 are connected by a flexible pipe 25 to allow for interflow of fluid. In a non-limiting implementation example, the semiconductor module 100 is utilized in a power electronic convertor on the seabed, the depth of the seabed being 3000 meters; likewise, the semiconductor module 100 needs to withstand water pressure at the seabed equivalent to 300 atmospheres.

Figure 2:
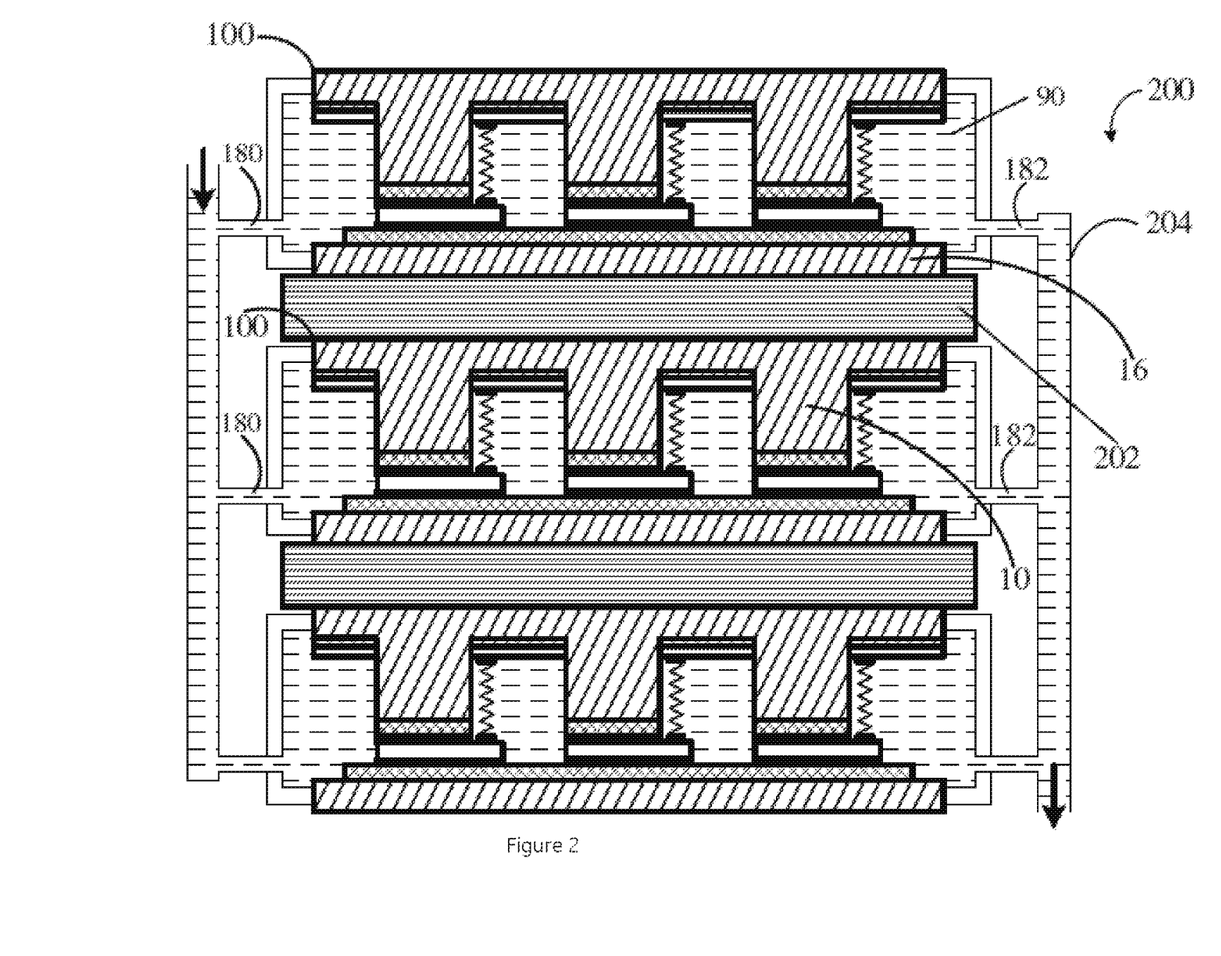
FIG. 2 is a sectional side view of one implementation method of the semiconductor module package.

The outer casing component 18 defines an internal space in the semiconductor module 100 that is filled with insulating fluid 90, and insulating fluid 90 is utilized to implement electrical insulation and cooling functions. As shown in FIG. 2, the internal space surrounding the protruding parts 102. In a non-limiting implementation example, insulating fluid 90 comprises but is not limited to silicone oil, mineral oils, synthetic oils, and organic esters.

When there is a pressure differential between the external pressure and internal pressure of the semiconductor module 100, or when there is a change in the temperature of the semiconductor module 100, the volume of the flexible pipe 25 is changed to compensate for the change in volume of insulating fluid 90.

Specifically, when the semiconductor 100 is exposed to the high-pressure environment of the seabed (for example, the seabed at a depth of 3000 meters where it needs to withstand a pressure equivalent to 300 atmospheres) and the external pressure of the semiconductor module 25 is greater than the internal pressure, the volume of the flexible pipe 25 decreases, causing insulating fluid 90 to flow from flexible pipe 25 into the internal space in the semiconductor 100. The insulating fluid is also able to deform by 1%-2% in the high-pressure environment, and consequently the insulating fluid 90 that fills the internal space in the semiconductor module 100 is subject to high pressure, causing the internal pressure of the semiconductor module 100 to appropriately increase, enabling it to resist the external pressure of the semiconductor module 100, causing the internal pressure in the semiconductor module 100 to attain equilibrium. Thus, it is able to prevent damage to the semiconductor module 100 installed between the electrically conductive top plate 12 and electrically conductive base plate 15 due to the high pressure.

When the semiconductor 100 emits heat due to conducting electricity during operation, it causes the temperature of the semiconductor module 100 to exceed a predetermined temperature. The insulating fluid 90 flows from the internal space in the semiconductor module 100 into the flexible pipe 25, causing the volume of the flexible pipe 25 to increase. Consequently, it is able to prevent the insulating fluid 90 filling the internal space in the semiconductor module 100 from expanding due to the high temperature and thus damaging the semiconductor module 100.

Proceeding one step further, in a non-limiting implementation example the semiconductor module 100 further comprises a plurality of springs 20, a gate circuit board 22 and an insulating layer 24. What needs explaining here is that FIG. 1 shows the quantity of the plurality of springs 20 to be three, but in the non-limiting implementation example, the quantity of the plurality of springs 20 can be two, three or more. Alternatively, the quantity of springs 20 can be one.

Each semiconductor 14 further comprises a third electrode. What needs explaining here is that the connection between the first electrode and the third electrode is a non-conductive connection, that is, insulating.

Each spring 20 of the plurality of springs 20 makes electrical contact between the gate circuit board 22 and the third electrode on each individual semiconductor chip 14 from the plurality of semiconductor chips 14, and an insulating layer 24 is installed between the first power supply connecting plate 10 and the gate circuit board 22. In a non-limiting implementation example, an insulating layer 24 is fixed onto the first power supply connecting plate 10 by means of insulating screws.

The main role of the plurality of springs 20 is to conduct electricity, that is, each spring 20 electrically connects 22 the third electrode on each individual semiconductor chip 14 of the plurality of semiconductor chips 14. A supplementary role of the springs 20 is to support gate circuit board 22. In a non-limiting example, plurality of electrically conductive top plates 12, plurality of semiconductor chips 14, electrically conductive base plate 15, plurality of springs 20, gate circuit board 22 and insulating layer 24 are installed between first power supply connecting plate 10 and second power supply connecting plate 16. Electrically conductive base plate 15, each semiconductor chip 14, and each electrically conductive top plate 12 of the plurality of electrically conductive top plates 12 are arranged sequentially in order in the direction from the second power supply connecting plate 10 to the first power supply connecting plate.

In the non-limiting implementation example, each semiconductor chip 14 can be an insulated gate bipolar transistor (IGBT) or a metal oxide semiconductor field effect transistor (MOSFET). According to an embodiment of the present invention, each semiconductor chip 14 as an IGBT for the purpose of providing an example, the third electrode is the gate, the first electrode is the collector and the second electrode is the emitter. When the first power supply connecting plate 10 is connected to positive voltage, the second power supply connecting plate 16 is connected to negative voltage, and when the gate circuit board 22 supplies the third electrode on each semiconductor chip 14 gate driving voltage (that is, electricity flows through the semiconductor module 100 and it operates), each semiconductor chip 14 indicates an ON state.

Similarly, in another non-limiting implementation example, the semiconductor module 100 does not comprise a gate circuit board 22 or insulating layer 24, and likewise, each semiconductor chip 14 does not comprise a third electrode; each semiconductor 14 can be a diode, the first electrode can be the anode and the second electrode can be the cathode. When the first power supply connecting plate 10 is connected to positive voltage and the second power supply connecting plate 16 is connected to negative voltage (that is, electricity flows through the semiconductor module 100 and it operates), each semiconductor chip 14 indicates an ON state.

Proceeding further, the semiconductor 100 further comprises a plurality of first adhesive layers 145 and a plurality of second adhesive layers 146. In a non-limiting implementation example, each first adhesive layer 145 and each second adhesive layer 146 is solder. What needs explaining here is that FIG. 1 shows the quantity of the plurality of first adhesive layers 145 and the plurality of second adhesive layers 146 to be three in each case, but in the non-limiting implementation example, the quantity of first adhesive layers 145 and plurality of second adhesive layers 146 can be two, three or more.

First adhesive layers 145 are installed between each semiconductor chip 14 of the plurality of semiconductor chips 14 and each electrically conductive top plate 12 of the plurality of electrically conductive top plates 12 to improve the performance of the electrical connection between the two.

The second adhesive layers 146 are installed between the electrically conductive base plate 15 and each semiconductor chip 14 of the plurality of semiconductor chips 14 to improve the performance of the electrical connection between the two.

FIG. 2 is a section view of the semiconductor module package 200 in an implementation example. This semiconductor module package 200 comprises at least two semiconductor modules 100 and at least one power supply interconnection plate 202. Each semiconductor module 100 of the two or more semiconductor modules 100 are identical to the semiconductor modules 100 shown in FIG. 1, and will not be repeated here.

What needs explaining here is that although FIG. 2 shows the quantity of semiconductor modules 100 to be three and the quantity of power supply interconnection plates 202 to be two, in the non-limiting implementation example the number of semiconductor modules 100 can be two, three or more, and the quantity of power supply interconnection plates 202 can be one, two or more.

At least one power supply interconnection plate 202 makes contact between the second power supply connecting plate 16 comprised in one semiconductor module 100 of the two or more semiconductor modules 100, and the first power supply connecting plate 10 comprised in the other semiconductor module 100 of the two or more semiconductor modules 100 in order to concatenate multiple semiconductor modules.

Similar to the semiconductor module 100 shown in FIG. 1, at least one opening in each semiconductor module 100 shown in FIG. 2 comprises a first opening 180 and a second opening 182, and the first opening 180 and second opening 182 comprised in each semiconductor module 100 of at least two semiconductor modules 100 are interconnected by a flexible pipe loop 204 to allow fluid interflow.

The internal space of each semiconductor module 100 is filled with insulating fluid 90. When there is a pressure differential between the external pressure and internal pressure of each semiconductor module 100 or when there is a change in temperature of each semiconductor module 100, the volume of the flexible pipe loop 204 is changed to compensate for the change in volume of insulating fluid 90.

Specifically, when the external pressure of each semiconductor module 100 is greater than the internal pressure, the volume of the flexible pipe loop 204 decreases, causing insulating fluid 90 to flow from the flexible pipe loop 204 into the internal space in each semiconductor module, causing the internal and external pressure of the semiconductor module 100 to attain equilibrium.

When the temperature of each semiconductor module 100 is greater than a predetermined temperature, the insulating fluid 90 flows from the internal space in the semiconductor module 100 into the flexible pipe loop 204, causing the volume of the flexible pipe loop 204 to increase and preventing the insulating fluid 90 that fills the internal space in the semiconductor module 100 from expanding due to the increase in temperature and thus causing damage to the semiconductor module 100.

Figure 3:
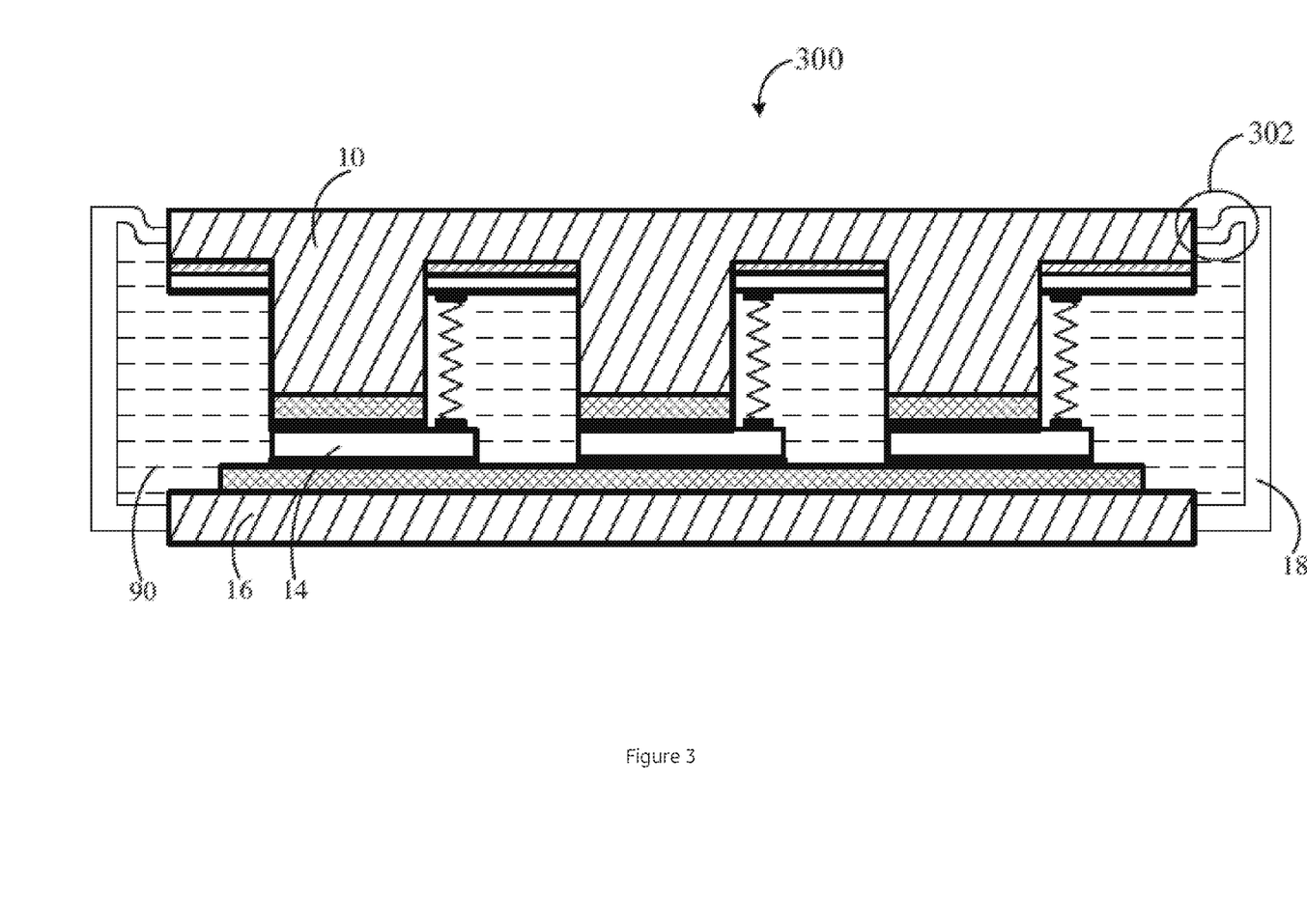
FIG. 3 is a sectional side view of the first implementation method of the semiconductor apparatus.

FIG. 3 is a section view of the semiconductor apparatus 300 in the first implementation method. The difference between the semiconductor apparatus 300 shown in FIG. 3 and the semiconductor module 100 shown in FIG. 1 is: the semiconductor apparatus 300 shown in FIG. 3 is sealed, and the electrically insulating outer casing component 18 of the semiconductor apparatus 300 shown in FIG. 3 is not provided with two openings 180 and 182; the semiconductor apparatus 300 shown in FIG. 3 further comprises a flexible component 302, and this flexible component 302 is installed on the electrically insulating outer casing component 18.

In the non-limiting implementation example, the flexible member 302 can be made from a metal or other material that deforms. The metal can be a malleable metal that easily deforms. Other materials can be composites such as plastic.

The internal space in the semiconductor apparatus 300 is filled with insulating fluid 90. When there is a pressure differential between the external pressure and internal pressure of the semiconductor apparatus 300 or when there is a change in the temperature of the semiconductor apparatus 300, the volume of the semiconductor apparatus 300 is changed to compensate for the change in volume of insulating fluid 90.

Specifically, when the external pressure of the semiconductor apparatus 300 is greater than the internal pressure, the flexible component 302 deforms causing the volume of the semiconductor apparatus 300 to decrease, leading to the volume of insulating fluid 90 being compressed (insulating fluid 90 can deform by 1% to 2% in a high pressure environment) causing the internal pressure of the semiconductor apparatus 300 to increase appropriately; it can resist the external pressure of the semiconductor apparatus 300, causing the internal pressure of the semiconductor apparatus 300 to attain equilibrium. It can thus prevent damage to semiconductor chips 14 between the electrically conductive top plates 12 and electrically conductive base plate 15 caused by excessively high pressure.

When the semiconductor apparatus 300 emits heat due to conducting electricity during operation, it causes the temperature of the semiconductor apparatus 300 to exceed a predetermined temperature. The flexible component 302 deforms, causing the volume of the semiconductor apparatus 300 to increase. Consequently, it can prevent insulating fluid 90 filling the internal space in the semiconductor apparatus 300 from expanding due to the rise in temperature and thus damaging the semiconductor apparatus 300.

Figure 4:
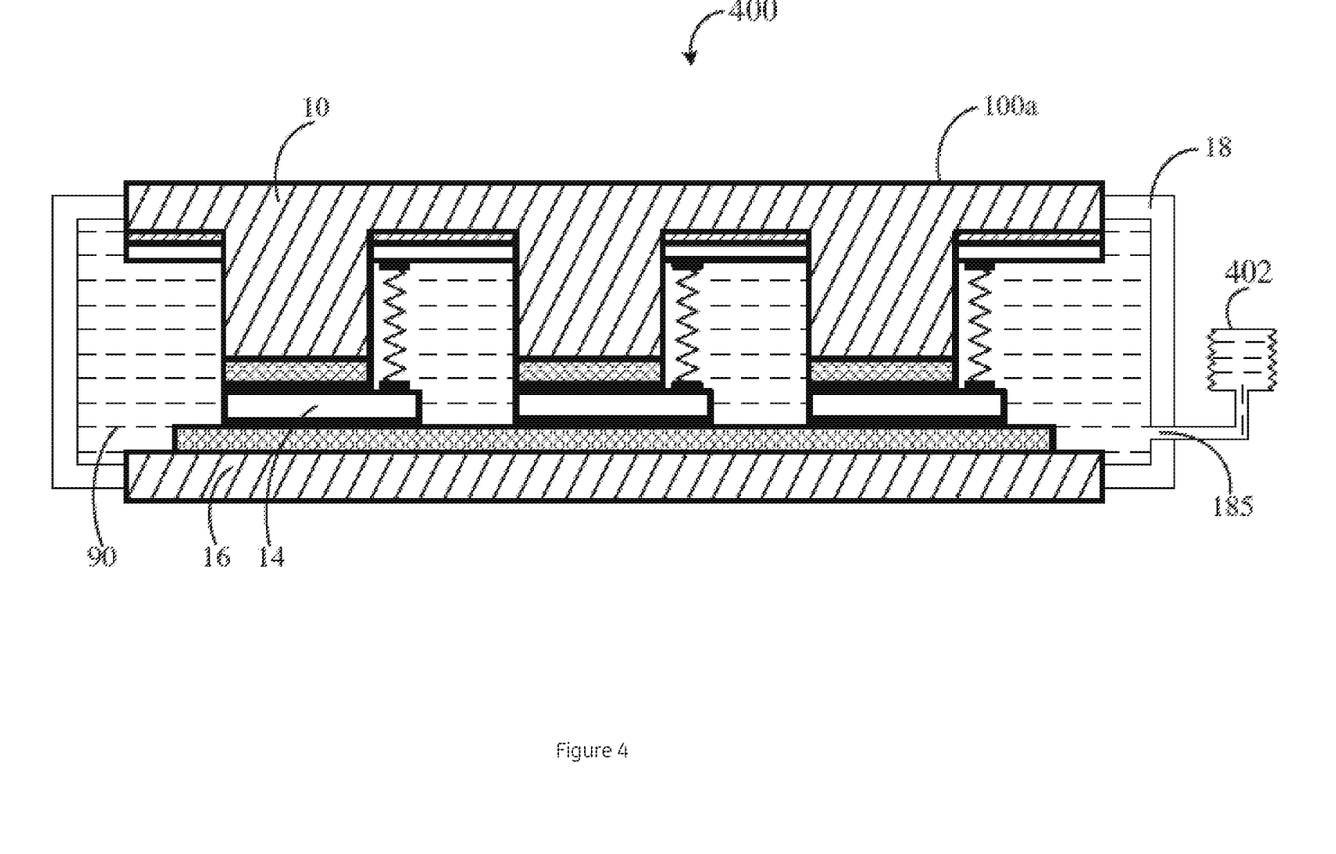
FIG. 4 is a sectional side view of the second implementation method of the semiconductor apparatus.

FIG. 4 is a section view of the semiconductor apparatus 400 in the second implementation example. The difference between the semiconductor apparatus 400 shown in FIG. 4 and the semiconductor module 100 shown in FIG. 1 is: the semiconductor apparatus 400 shown in FIG. 4 is sealed; as shown in FIG. 4, the electrically insulating outer casing component 18 comprised in the semiconductor module 100a is only provided with one opening 185; the semiconductor apparatus 400 shown in FIG. 4 further comprises a flexible unit 402, and the flexible unit 402 and opening 185 are connected to allow interflow of fluid.

In the non-limiting implementation example, the flexible unit 402 can be made from a metal. The metal can be a malleable metal that deforms easily.

The internal space in the semiconductor apparatus 400 is filled with insulating fluid 90. When there is a pressure differential between the external pressure and internal pressure of the semiconductor apparatus 400 or when there is a change in the temperature of the semiconductor apparatus 400, the volume of the semiconductor apparatus 400 is changed to compensate for the change in volume of insulating fluid 90.

Specifically, when the external pressure of the semiconductor apparatus 400 is greater than the internal pressure, the volume of the flexible unit 402 decreases, causing insulating fluid 90 to flow from the flexible unit 402 into the internal space of the semiconductor module 100a causing the insulating fluid 90 in the semiconductor module 100a to become compressed, and consequently it can prevent semiconductor chips 14 installed between the electrically conductive top plates 12 and electrically conductive base plate 15 being damaged by excessive pressure.

When the temperature of the semiconductor apparatus 400 is greater than a predetermined temperature, the insulating fluid 90 flows from the internal space in the semiconductor module 100a into the flexible unit 402, causing the volume of the flexible unit 402 to increase. Consequently, it can prevent the insulating fluid 90 that fills the internal space in the semiconductor apparatus 400 from expanding due to the rise in temperature and thus damaging the semiconductor apparatus 400.

Although this invention has been explained in conjunction with specific implementation examples, this invention can be modified and changed in many ways, as a technician skilled in the field would understand. Consequently it must be noted that the intent of the claims covers all such modifications and changes within the true spirit of this invention.

What is claimed is:

1. A semiconductor module, comprising:
a plurality of conductive top plates;
a conductive base plate;
a plurality of semiconductor chips installed on the conductive base plate and contacting the conductive top plates respectively, each of the semiconductor chips comprising a first electrode electrically coupled to the conductive base plate and a second electrode electrically coupled to the corresponding conductive top plate;
a first power supply connection plate;
a plurality of protrusions extending from the first power supply connection plate and electrically connecting respective conductive top plates;
a second power supply connection plate electrically connecting the conductive base plate; and
a housing element for holding together the first power supply connection plate and the second power supply connection plate the housing element defining an internal space surrounding the plurality of protrusions extending from the first power supply connection plate, the housing element defining at least one opening through a sidewall thereof;
a volume of insulation fluid being contained in the internal space of the housing element;
a flexible pipe having an end thereof fluidly coupled to the opening in the housing element, the flexbible pipe being configured to allow interflow of the insulation fluid to compensate a change in volume of the insulation fluid due to differences between an external and an internal pressure of the semiconductor modul or due to a temperature change of the semiconductor module.

2. The semiconductor module of claim 1, further comprising:
the flexible pipe being configured so that a volume thereof is variable, wherein if the external pressure of the semiconductor module is greater than the internal pressure of the semiconductor module, the volume of the flexible pipe is decreased, such that the insulation fluid is flowed from the flexible pipe to an internal space of the semiconductor module, and
if a temperature of the semiconductor module is greater than a predetermined temperature, the insulation fluid is flowed from the internal space of the semiconductor module to the flexible pipe, such that the volume of the flexible pipe is increased.

3. The semiconductor module of claim 1, further comprising:
a printed circuit board (PCB);
an insulation layer; and
one or more springs,
wherein:
each of the semiconductor chips further comprises a third electrode, each of the one or more springs is electrically contacted between the third electrode of a respective semiconductor chip of the semiconductor chips and the PCB, and
the insulation layer is installed between the first power supply connection plate and the PCB.

4. The semiconductor module of claim 3, wherein the conductive top plates, the conductive base plate, the semiconductor chips, the PCB, the insulation layer, and the one or more springs are installed between the first power supply connection plate and the second power supply connection plate.

5. The semiconductor module of claim 1, further comprising:
a plurality of first adhesive layers; and
a plurality of second adhesive layers,
wherein:
each of the first adhesive layers attaches a respective semiconductor chip of the semiconductor chips to the conductive base plate, and
each of the second adhesive layers attaches the respective semiconductor chip of the semiconductor chips to a respective conductive top plate of the conductive top plates.

6. A semiconductor module assembly, comprising:
at least two semiconductor modules; and
at least one power interconnection plate,
wherein each of the at least two semiconductor modules comprises:
a plurality of conductive top plates;
a conductive base plate;
a plurality of semiconductor chips installed on the conductive base plate and contacting the conductive top plates respectively, each of the semiconductor chips comprising a first electrode electrically coupled to the conductive base plate and a second electrode electrically coupled to the corresponding conductive top plate;
a first power supply connection plate, a plurality of protrusions extending from the first power supply connection plate and electrically connecting respective conductive top plates;
a second power supply connection plate electrically connecting the conductive base plate; and
a housing element for holding together the first power supply connection plate and the second power supply connection plate, the housing element defining an internal space surrounding the plurality of protrusions extending from the first power supply connection plate, the housing element defining first and second openings through a sidewall thereof,
a volume of insulation fluid being contained in the internal space of the housing element;
wherein the at least one power interconnection plate is configured to electrically connect between the second power supply connection plate of one of the at least two semiconductor modules and the first power supply connection plate of another one of the at least two semiconductor modules; and
a flexible pipe fluidly coupled to each of the first and second openings in the housing element of each of the semiconductor modules, the flexbible pipe being configured to allow interflow of the insulation fluid to compensate a change in volume of the insulation fluid due to differences between an external and an internal pressure of the semiconductor modules or due to a temperature change of the semiconductor modules.

7. The semiconductor module assembly of claim 6, further comprising the flexible pipe being configured so that a volume thereof is variable, wherein:
if the external pressure of each semiconductor module is greater than the internal pressure of each semiconductor module, the volume of the flexible pipe loop is decreased, such that the insulation fluid is flowed from the flexible pipe loop to the internal space of each semiconductor module, and if a temperature of each semiconductor module is greater than a predetermined temperature, the insulation fluid is flowed from the internal space of each semiconductor module to the flexible pipe loop, such that the volume of the flexible pipe loop is increased.

8. The semiconductor module assembly of claim 6, wherein:
each of the at least two semiconductor modules further comprises a printed circuit board (PCB), an insulation layer, and one or more springs,
each of the semiconductor chips further comprises a third electrode, each of the one or more springs is electrically connected between the third electrode of a respective semiconductor chip of the semiconductor chips and the gate PCB, and
the insulation layer is installed between the first power supply connection plate and the PCB.

9. The semiconductor module assembly of claim 8, wherein the conductive top plates, the conductive base plate, the semiconductor chips, the PCB, the insulation layer, and the one or more springs are installed between the first power supply connection plate and the second power supply connection plate.

10. The semiconductor module assembly of claim 6, wherein:
each of the at least two semiconductor modules further comprises a plurality of first adhesive layers and a plurality of second adhesive layers,
each of the first adhesive layers attaches a respective semiconductor chip of the semiconductor chips to the conductive base plate, and
each of the second adhesive layers attaches the respective semiconductor chip of the semiconductor chips to a respective conductive top plate of the conductive top plates.

11. A semiconductor device, comprising:
a semiconductor module comprising:
a plurality of conductive top plates;
a conductive base plate;
a plurality of semiconductor chips disposed on the conductive base plate and contacting the conductive top plates respectively, each of the semiconductor chips comprising a first electrode electrically coupled to the conductive base plate and a second electrode electrically coupled to the corresponding conductive top plate;
a first power supply connection plate, a plurality of protrusions extending from the first power supply connection plate and electrically connecting respective conductive top plates;
a second power supply connection plate electrically connecting the conductive base plate; and
a housing element for holding together the first power supply connection plate and the second power supply connection plate; wherein the semiconductor device is sealed, the housing element defining an internal space substantially filled with insulation fluid;
the housing element further compring one of a flexible ring and a flexible unit fluidly coupled to the housing element, wherein a volume of the semiconductor device is variable to compensate volume change of the insulation fluid due to differences between an external pressure and an internal pressure of the semiconductor device or due to temperature changes of the semiconductor device.

12. The semiconductor device of claim 11, wherin the housing element comprises a flexible unit coupled thereto, the housing element defining an open hole in fluid communication with the flexible unit, so that if the external pressure of the semiconductor device is greater than the internal pressure of the semiconductor device, a volume of the flexible unit is decreased, such that the insulation fluid is flowed from the flexible unit to an internal space of the semiconductor module, and
if the temperature of the semiconductor device is greater than a predetermined temperature, the insulation fluid is flowed from the internal space of the semiconductor module to the flexible unit, such that the volume of the flexible unit is increased.

13. The semiconductor device of claim 11, wherin the housing element comprises a flexible ring,
the flexible ring is disposed on the housing element and is configured to be elastically deformed if the external pressure of the semiconductor device is greater than the internal pressure of the semiconductor device, such that a volume of the semiconductor device is decreased, and
the flexible ring is further configured to be elastically deformed if the temperature of the semiconductor device is greater than a predetermined temperature, such that the volume of the semiconductor device is increased.

14. The semiconductor device of claim 11, wherein the semiconductor module further comprises:
a printed circuit board (PCB);
an insulation layer; and
one or more springs,
wherein:
each of the semiconductor chips further comprises a third electrode, each of the one or more springs is electrically connected between the third electrode of a respective semiconductor chip of the semiconductor chips and the PCB, and
the insulation layer is disposed between the first power supply connection plate and the PCB.

15. The semiconductor device of claim 14, wherein the conductive top plates, the conductive base plate, the semiconductor chips, the PCB, the insulation layer, and the one or more springs are disposed between the first power supply connection plate and the second power supply connection plate.

16. The semiconductor device of claim 11, wherein the semiconductor module further comprises:
a plurality of first adhesive layers; and
a plurality of second adhesive layers,
wherein:
each of the first adhesive layers attaches a respective semiconductor chip of the semiconductor chips to the conductive base plate, and
each of the second adhesive layers attaches the respective semiconductor chip of the semiconductor chips to a respective conductive top plate of the conductive top plates.

* * * * *